(12) United States Patent
Minami et al.

(10) Patent No.: US 12,274,065 B2
(45) Date of Patent: Apr. 8, 2025

(54) SEMICONDUCTOR MEMORY DEVICE

(71) Applicant: Kioxia Corporation, Tokyo (JP)

(72) Inventors: Toshifumi Minami, Yokohama Kanagawa (JP); Atsuhiro Sato, Meguro Tokyo (JP); Keisuke Yonehama, Kamakura Kanagawa (JP); Yasuyuki Baba, Zama Kanagawa (JP); Hiroshi Shinohara, Yokosuka Kanawaga (JP); Hideyuki Kamata, Kawasaki Kanagawa (JP); Teppei Higashitsuji, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/666,035

(22) Filed: May 16, 2024

(65) Prior Publication Data

US 2024/0306393 A1    Sep. 12, 2024

Related U.S. Application Data

(63) Continuation of application No. 18/176,656, filed on Mar. 1, 2023, now Pat. No. 12,022,657, which is a
(Continued)

(30) Foreign Application Priority Data

Sep. 8, 2014    (JP) .................. 2014-182641

(51) Int. Cl.
| | | |
|---|---|---|
| *H10B 43/27* | (2023.01) | |
| *H01L 29/792* | (2006.01) | |
| *H10B 41/20* | (2023.01) | |
| *H10B 41/27* | (2023.01) | |
| *H10B 43/00* | (2023.01) | |
| *H10B 43/10* | (2023.01) | |
| *H10B 43/20* | (2023.01) | |
| *H10B 43/35* | (2023.01) | |

(52) U.S. Cl.
CPC ......... *H10B 43/27* (2023.02); *H01L 29/7926* (2013.01); *H10B 41/20* (2023.02); *H10B 41/27* (2023.02); *H10B 43/00* (2023.02); *H10B 43/10* (2023.02); *H10B 43/20* (2023.02); *H10B 43/35* (2023.02)

(58) Field of Classification Search
CPC ........ H10B 43/27; H10B 43/20; H10B 43/10; H10B 41/27; H10B 41/20
See application file for complete search history.

(56) References Cited

U.S. PATENT DOCUMENTS 8,803,222 B2    8/2014    Lee et al.
8,994,094 B2    3/2015    Matsuda
(Continued)

FOREIGN PATENT DOCUMENTS

JP    2009-266946 A    11/2009

*Primary Examiner* — Jose R Diaz
(74) *Attorney, Agent, or Firm* — Kim & Stewart LLP

(57) ABSTRACT

A semiconductor memory device includes a conducting layer and an insulating layer that are disposed above a semiconductor substrate, a plurality of pillars that extend in a direction which crosses a surface of the semiconductor substrate, and a plate that is disposed between the plurality of pillars and extends in the same direction as the pillars. A surface of the plate, which faces the pillars, has convex portions and non-convex portions.

20 Claims, 5 Drawing Sheets

Related U.S. Application Data continuation of application No. 17/700,951, filed on Mar. 22, 2022, now Pat. No. 11,621,278, which is a continuation of application No. 17/021,121, filed on Sep. 15, 2020, now Pat. No. 11,315,950, which is a continuation of application No. 16/569,951, filed on Sep. 13, 2019, now Pat. No. 10,818,691, which is a continuation of application No. 15/894,832, filed on Feb. 12, 2018, now Pat. No. 10,461,093, which is a continuation of application No. 14/630,507, filed on Feb. 24, 2015, now Pat. No. 9,893,078.

(56) References Cited

U.S. PATENT DOCUMENTS

| | | | |
|---|---|---|---|
| 9,219,070 B2 | 12/2015 | Thimmegowda et al. | |
| 9,362,306 B2 | 6/2016 | Park et al. | |
| 9,917,094 B2 | 3/2018 | Lee et al. | |
| 10,818,691 B2 | 10/2020 | Minami et al. | |
| 11,315,950 B2 | 4/2022 | Minami et al. | |
| 2010/0013049 A1 | 1/2010 | Tanaka et al. | |
| 2010/0207190 A1 | 8/2010 | Katsumata et al. | |
| 2010/0207194 A1 | 8/2010 | Tanaka et al. | |
| 2011/0147824 A1 | 6/2011 | Son et al. | |
| 2012/0156850 A1 | 6/2012 | Yang | |
| 2012/0208347 A1 | 8/2012 | Hwang et al. | |
| 2012/0326223 A1 | 12/2012 | Omura | |
| 2013/0056816 A1 | 3/2013 | Iwase et al. | |
| 2013/0126959 A1 | 5/2013 | Aburada et al. | |
| 2013/0134507 A1 | 5/2013 | Takaishi | |
| 2013/0234233 A1 | 9/2013 | Fujiwara et al. | |
| 2014/0035023 A1 | 2/2014 | Ahn | |
| 2015/0001460 A1 | 1/2015 | Kim et al. | |
| 2015/0340376 A1 | 11/2015 | Park et al. | |
| 2016/0049422 A1 | 2/2016 | Kim et al. | |
| 2016/0049423 A1 | 2/2016 | Yoo et al. | |
| 2016/0071870 A1 | 3/2016 | Minami et al. | |
| 2016/0078943 A1 | 3/2016 | Yamada | |
| 2016/0079252 A1 | 3/2016 | Yamashita | |
| 2016/0141419 A1* | 5/2016 | Baenninger | H10B 41/20 257/314 |

\* cited by examiner

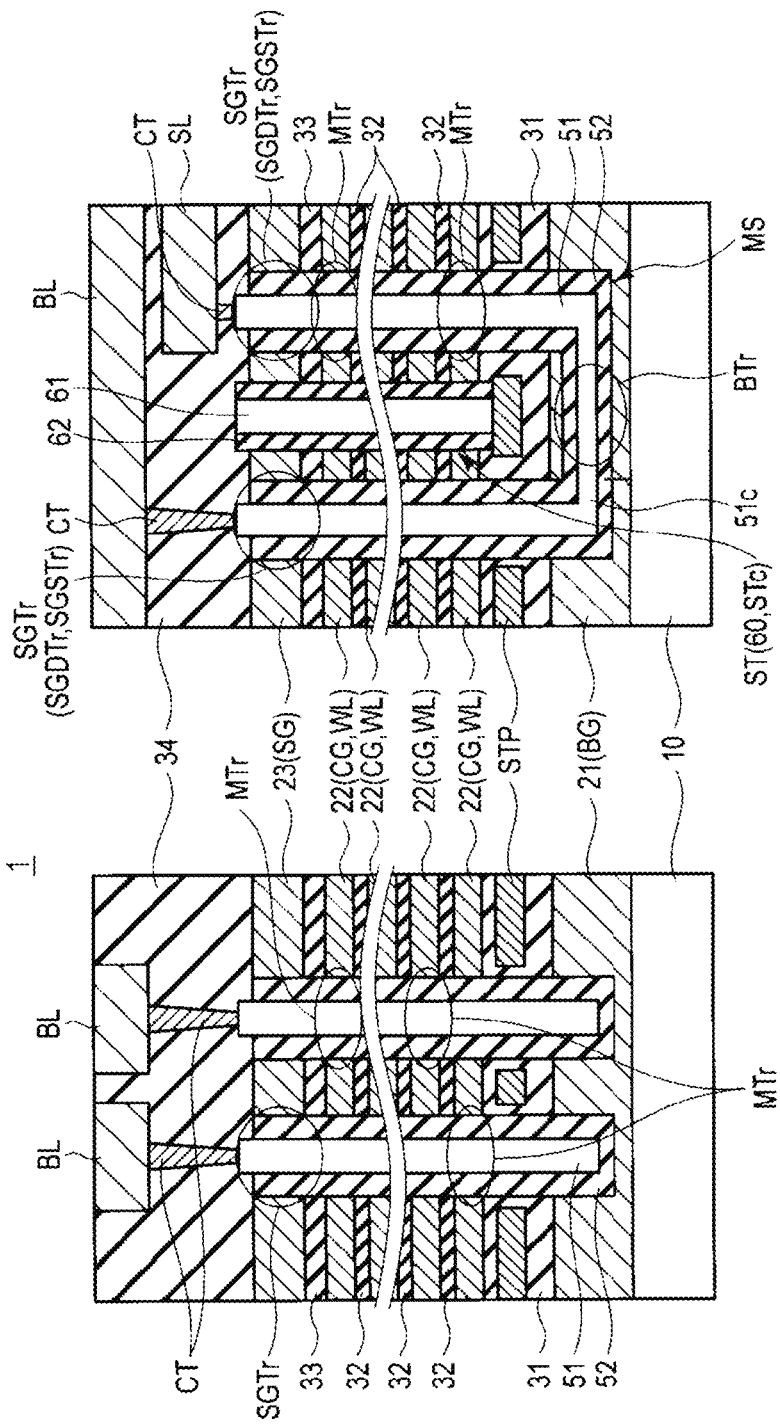

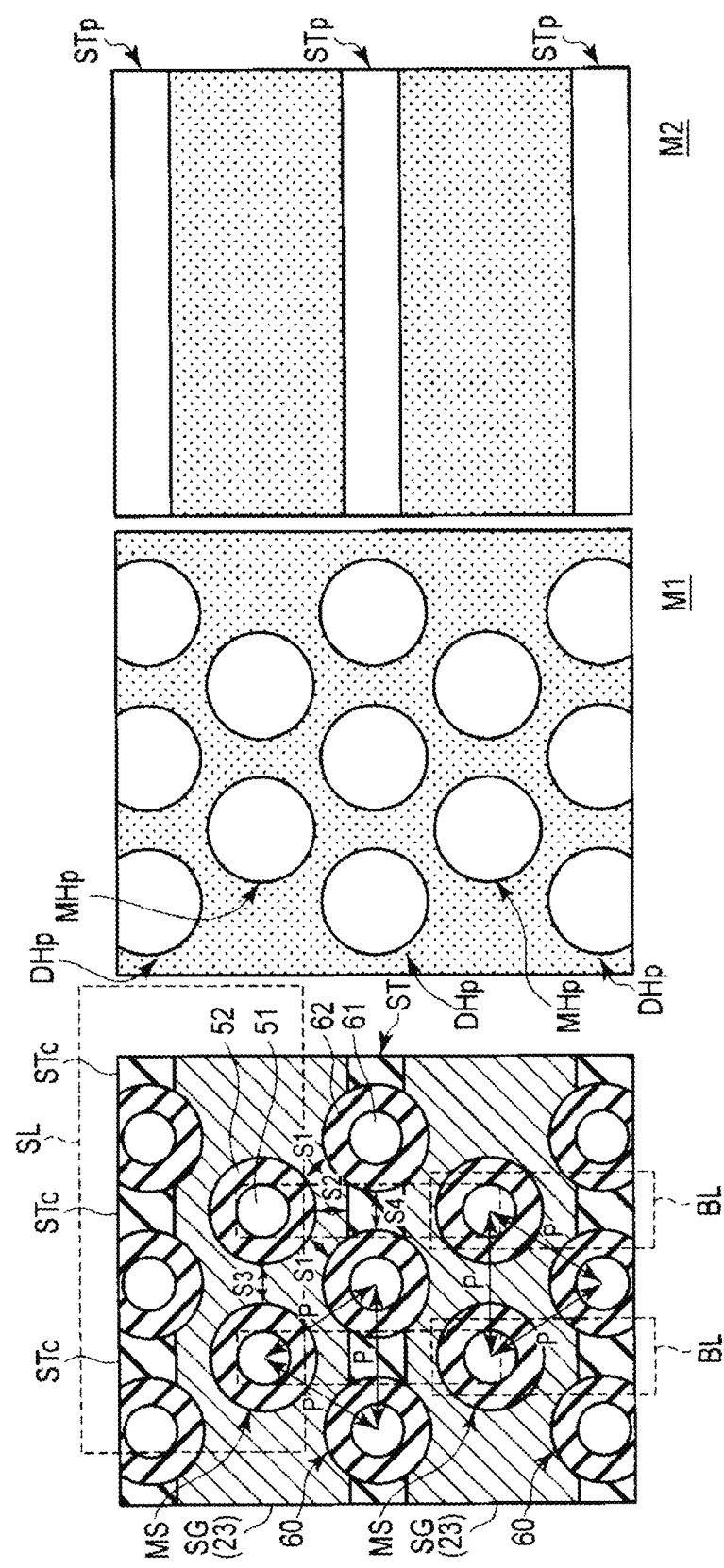

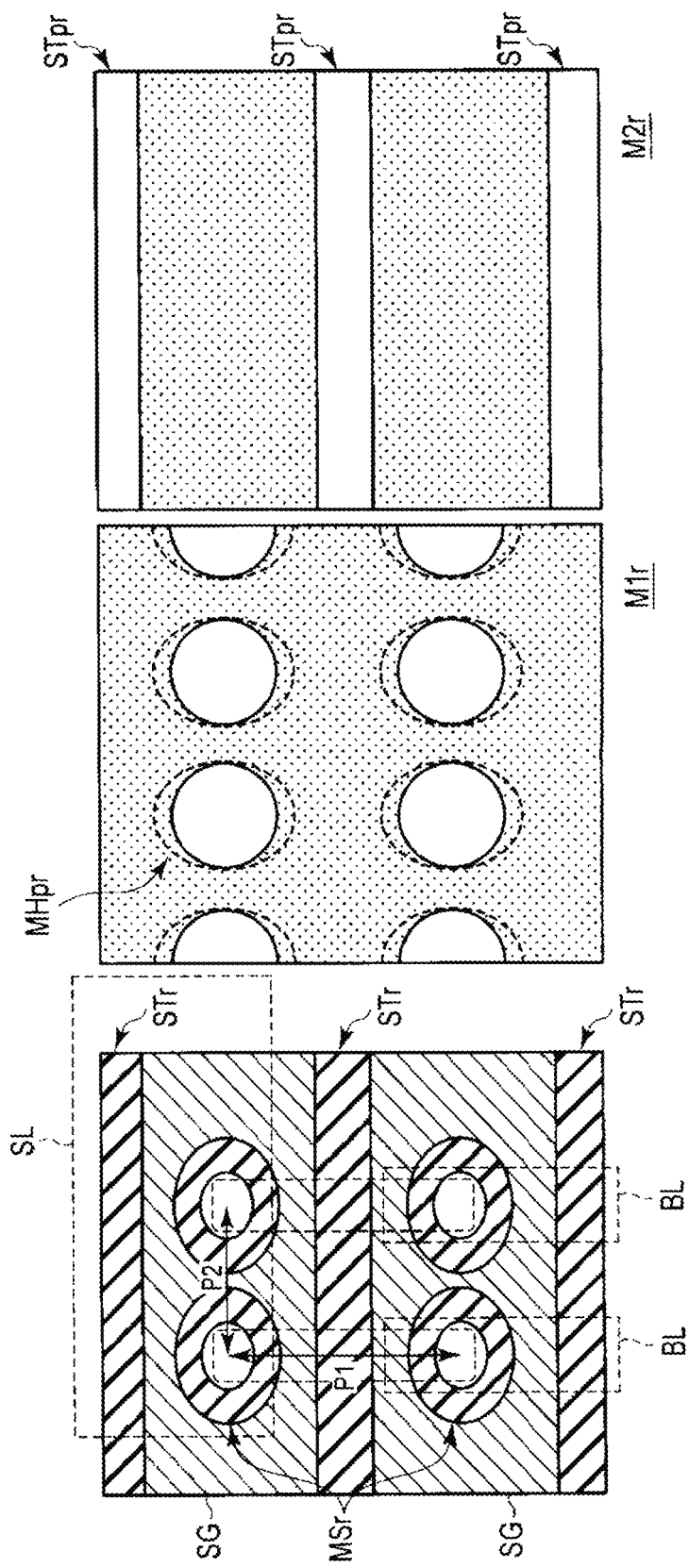

SEMICONDUCTOR MEMORY DEVICE

CROSS-REFERENCE TO RELATED APPLICATIONS

This application is a continuation of U.S. patent application Ser. No. 18/176,656, filed on Mar. 1, 2023, which is a continuation of U.S. patent application Ser. No. 17/700,951, filed on Mar. 22, 2022, now U.S. Pat. No. 11,621,278, issued on Apr. 4, 2023, which is a continuation of U.S. patent application Ser. No. 17/021,121, filed on Sep. 15, 2020, now U.S. Pat. No. 11,315,950, issued on Apr. 26, 2022, which is a continuation of U.S. patent application Ser. No. 16/569,951, filed on Sep. 13, 2019, now U.S. Pat. No. 10,818,691, issued on Oct. 27, 2020, which is a continuation of U.S. patent application Ser. No. 15/894,832, filed on Feb. 12, 2018, now U.S. Pat. No. 10,461,093, issued on Oct. 29, 2019, which is a continuation of U.S. patent application Ser. No. 14/630,507, filed on Feb. 24, 2015, now U.S. Pat. No. 9,893,078, issued on Feb. 13, 2018, which is based upon and claims the benefit of priority from Japanese Patent Application No. 2014-182641, filed on Sep. 8, 2014, the entire contents of each of which are incorporated herein by reference.

FIELD

Embodiments described herein relate generally to a semiconductor memory device.

BACKGROUND

A NAND-type flash memory (hereinafter, referred to as a BiCS memory) in which memory cells are arranged in three dimensions, is known.

BRIEF DESCRIPTION OF THE DRAWINGS

FIGS. 2A and 2B are partial views illustrating an example of the configuration of the semiconductor memory device according to the first embodiment, where FIG. 2A is a cross-sectional view taken along line A-A in FIG. 1, and FIG. 2B is a cross-sectional view taken along line B-B in FIG. 1.

FIGS. 3A to 3C are views illustrating the semiconductor memory device according to the first embodiment and a method of manufacturing the same, where FIG. 3A is a plan view illustrating a part of the semiconductor memory device, and FIGS. 3B and 3C are plan views illustrating a part of a transfer film used in the manufacturing method.

FIGS. 4A to 4C are views illustrating a semiconductor memory device according to a comparative example and a method of manufacturing the same, where FIG. 4A is a plan view illustrating a part of the semiconductor memory device, and FIGS. 4B and 4C are plan views illustrating a part of a transfer film used in the manufacturing method.

FIG. 5A is a plan view illustrating a part of the semiconductor memory device, and FIG. 5B is a plan view illustrating a part of a transfer film used in the manufacturing method.

DETAILED DESCRIPTION

Figure 1:
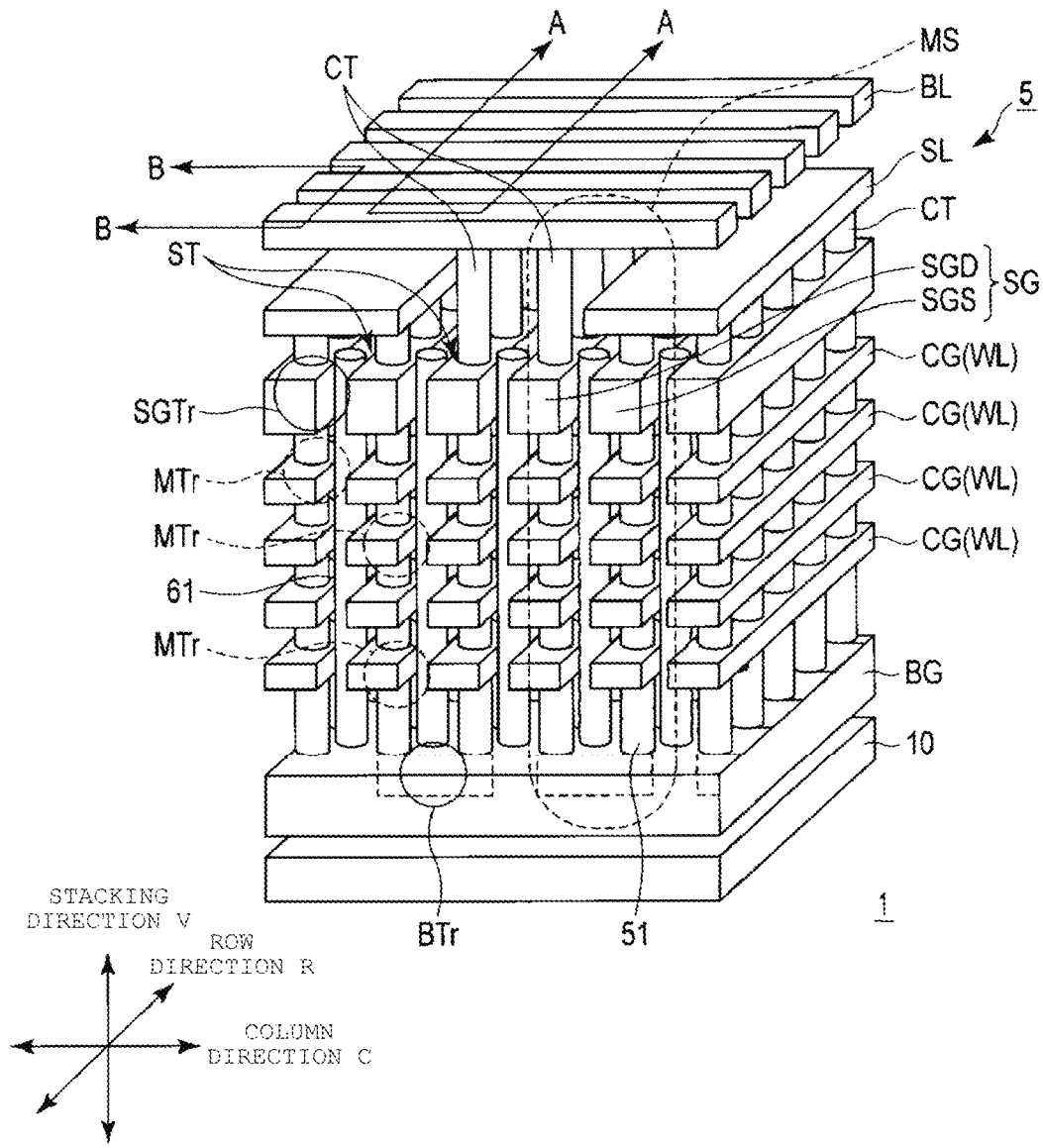
FIG. 1 is a perspective view illustrating a part of a semiconductor memory device according to a first embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to limit the scope of the invention. As used herein, the singular forms "a," "an" and "the" are intended to include the plurality of forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Embodiments provide a semiconductor memory device with improved process accuracy.

In general, according to one embodiment, a semiconductor memory device includes a conducting layer and an insulating layer that are disposed above a semiconductor substrate, a plurality of pillars that extend in a first direction which crosses a surface of the semiconductor substrate, and a plate that is disposed between the plurality of pillars and extends in the first direction. A surface of the plate, which faces the pillars, has convex portions and non-convex portions.

Hereinafter, the semiconductor memory device according to the embodiments will be described with reference to the drawings. In the drawings, the same reference signs will be assigned to the same portions. Descriptions will be repeated only as needed.

First Embodiment

The semiconductor memory device according to the embodiment includes conducting layers and insulating layers, a plurality of pillars, and plates. The conducting layers and the insulating layers are disposed above a semiconductor substrate. The plurality of pillars extend in a direction that intersect a first surface of the semiconductor substrate. The plates are disposed between the plurality of pillars. A surface of the plate, which faces the pillars, has convex portions and non-convex portions. Hereinafter, the semiconductor memory device will be described with reference to FIGS. 1 to 4C.

(1) Example of Configuration of BiCS Memory

An example of the configuration of the semiconductor memory device according to the embodiment will be described with reference to FIGS. 1 to 3A. FIG. 1 does not illustrate the insulating layers. In FIG. 1 and the subsequent drawings, the semiconductor memory device is disposed on an upper surface of a semiconductor substrate 10. In the drawings, a stacking direction V refers to a direction in which layers are stacked on the upper surface of the semiconductor substrate 10.

As illustrated in FIG. 1, a BiCS memory 1 is the semiconductor memory device according to the embodiment, and includes a memory cell array 5 on the semiconductor substrate 10. FIG. 2 illustrates a part of an internal configuration of the memory cell array 5.

Electrode

As illustrated in FIGS. 2A and 2B, the BiCS memory 1 includes a plurality of conducting layers 22 and a plurality of insulating layers 32. The plurality of conducting layers 22 and the plurality of insulating layers 32 are disposed above the semiconductor substrate 10.

The memory cell array 5 in FIG. 1 is made by alternately stacking the conducting layers 22 and the insulating layers 32 on each other. Specifically, a conducting layer 21 is provided on the semiconductor substrate 10, and an insulating layer 31 is provided on the conducting layer 21, and the plurality of conducting layers 22 and the plurality of insulating layers 32 are provided on the insulating layer 31. The conducting layer 21 contains silicon and the like. The silicon contains impurities, for example, phosphorus (P). The conducting layer 21 functions as a back gate BG. The insulating layer 31 is provided with a stopper layer STP that contains metal and the like. The stopper layer STP functions as an etching stopper when forming a plate ST which will be described below.

The plurality of conducting layers 22 contain silicon and the like. The silicon contains impurities, for example, boron (B). The conducting layer 22 functions as a control gate CG (word line WL). FIGS. 1 and 2B exemplarily illustrate the stacking of four layers of the control gates CG (word lines WL), but the embodiment is not limited to this example.

The plurality of insulating layers 32 insulate the control gates CG from each other. That is, the insulating layer 32 functions as an inter-electrode insulating layer.

An insulating layer 33 is provided on an uppermost layer of the control gate CG. A conducting layer 23 is provided on the insulating layer 33. The conducting layer 23 contains silicon and the like. The silicon contains impurities, for example, boron (B). The conducting layer 23 functions as a selection gate SG. That is, the selection gate SG is provided above the uppermost layer of control gate CG, and on the insulating layer 33.

Memory Cell Transistor

The BiCS memory 1 includes a silicon column 51 as a first pillar, and a memory film 52 as a first insulating film.

The silicon column 51 extends in the direction that intersects the upper surface of the semiconductor substrate 10. For example, the direction is perpendicular or substantially perpendicular to the upper surface of the semiconductor substrate 10, and coincides with a direction (stacking direction V) in which the plurality of conducting layers 22 and the plurality of insulating layers 32 are stacked.

Specifically, the silicon column 51 extends in the stacking direction V through the selection gate SG, the insulating layer 33, the control gates CG, the insulating layers 32 (inter-electrode insulating layers), and the back gate BG. For example, the silicon column 51 has a circular column shape. A plurality of the silicon columns 51 are disposed along the upper surface of the semiconductor substrate 10 with an arbitrary gap maintained therebetween.

The memory film 52 surrounds a side wall of the silicon column 51. For example, the memory film 52 has a tunnel insulating layer, a charge storage layer, and a block insulating layer. The tunnel insulating layer surrounds the side wall of the silicon column 51. The charge storage layer surrounds a side wall of the tunnel insulating layer. The block insulating layer surrounds a side wall of the charge storage layer. The tunnel insulating layer contains silicon oxide, silicon nitride, or the like. The charge storage layer contains silicon oxide, silicon nitride, or the like. The charge storage layer is configured to hold charges. The block insulating layer contains silicon oxide, silicon nitride, or the like.

A pair of the silicon columns 51 line up in a column direction C, and are connected to each other in the back gate BG. The pair of the silicon columns 51, and a portion that connects the pair of the silicon columns 51 form a U shape. The portion which connects the silicon columns 51 includes a silicon column 51c having a circular column shape, and a silicon film 52 that surrounds a side wall of the silicon column 51c.

The following transistors are configured to include the silicon columns 51 and 51c, the memory films 52 on the circumferences of the silicon columns 51 and 51c, and various gates CG, SG, and BG: a memory cell transistor MTr, which is a memory cell; a selection gate transistor SGTr (selection gate drain transistor SGDTr and selection gate source transistor SGSTr); and a back gate transistor BTr. The silicon columns 51 and 51c function as channels and source/drain diffusion layers of the transistors MTr, SGTr, and BTr. For example, the structure of a MONOS is formed of the control gate CG, the block insulating layer made of silicon oxide or the like, the charge storage layer made of silicon nitride or the like, the tunnel insulating layer made of silicon oxide or the like, and the silicon column 51.

A current flow path is formed between the selection gate drain transistor SGDTr and the selection gate source transistor SGSTr so as to connect the plurality of memory cell transistors MTr and the back gate transistor BTr in series. Accordingly, a memory string MS is formed.

Various transistors such as the memory cell transistor MTr disposed in the memory cell array 5 illustrated in FIG. 1 form a three-dimensional matrix shape. The memory cell array 5 is an aggregate of the various transistors.

Plate

FIG. 3A which will be described below illustrates an upper surface of the selection gate SG (the conducting layer 23), but does not illustrate the configuration of the upper layers of the selection gate SG.

As illustrated in FIGS. 2A to 3A, the BiCS memory 1 includes the plates ST. The plate ST is disposed between the silicon columns 51. The plate ST extends through the plurality of conducting layers 22 and the plurality of insulating layers 32 in the stacking direction V and in a row direction R, and separates the memory cell transistors MTr which are adjacent to each other in the column direction C.

A surface of the plate ST, which faces the silicon columns 51, has convex portions and non-convex portions. More specifically, the plate ST includes a plurality of convex portions 60 and a plurality of non-convex portions STc. The non-convex portion STc is disposed to be interposed between the adjacent convex portions 60. For example, the convex portion protrudes from lateral opposite sides of the plate ST toward the silicon columns 51.

The convex portion 60 and the non-convex portion STc extend through the selection gate SG, the insulating layer 33, the control gate CG, and the insulating layer 32 (inter-electrode insulating layer) in the stacking direction V, and reaches the stopper layer STP in the insulating layer 31. The plurality of convex portions 60 are arranged in the row direction R, and the non-convex portions STc extend in the row direction R, each of which connects the adjacent convex portions 60.

The convex portions 60 are collectively formed in the same process as the silicon columns 51 and the memory films 52, which will be described later. Accordingly, for example, the convex portion 60 is made of the same material as the silicon column 51 and the memory film 52, and has the same or similar configuration as the silicon column 51 and the memory film 52. The convex portion 60, however, is a dummy that does not function as the memory cell transistor MTr. In alternative embodiments, the convex portion 60 may not be made of the same material as the silicon column 51 and the memory film 52, and may not have the same or similar configuration as the silicon column 51 and the memory film 52. In the example described below, the convex portion 60 has the same configuration as the silicon column 51 and the memory film 52.

The convex portion 60 includes a silicon column 61 as a second pillar, and an insulating film 62. For example, the silicon column 61 has a circular column shape. A plurality of silicon columns 61 are disposed along the upper surface of the semiconductor substrate 10 with an arbitrary gap maintained therebetween. The insulating film 62 surrounds a side wall of the silicon column 61. The insulating film 62 contains silicon oxide, silicon nitride, or the like.

The non-convex portion STc connects the convex portions 60 which are adjacent to each other in the row direction R. For example, the configuration of the non-convex portion STc is made by embedding an insulating member in a groove. A second insulating film includes the insulating film 62 and the insulating member in the non-convex portion STc. The second insulating films surround a plurality of silicon columns 61.

In the disposition of the plates ST as described above, the plates ST are continuously connected to each other via the convex portions 60 that are disposed with an arbitrary gap held therebetween. The width of the plate ST is set to have a width by which the memory cell transistors MTr separated by the plate ST may be electrically insulated from each other. Since the plates ST are continuously connected to each other, the plates ST make element separation possible.

The plates ST separate the selection gates SG, and the control gates CG of each layer along the column direction C. The plates ST extends in the row direction. For example, since the control gates CG are divided row by row along the column direction C, even when the memory cell transistors MTr are disposed at high density, leak current or the like is reduced. The selection gates SG separated from each other along the column direction C are alternately connected to each other at one end and the other end in the row direction R. The selection gates SG alternately connected to each other become a selection gate drain SGD and a selection gate source SGS in every other row.

Hereinafter, several examples of the configuration of the plates ST will be described.

The convex portion 60 may have various shapes other than the shape in the example illustrated in FIG. 3A.

For example, the convex portion 60 may have a shape elongated toward the non-convex portions STc on opposite sides. As a result, different from the example illustrated in FIG. 3A, the array of the convex portions 60 and the non-convex portions STc may have a top view shape that is made by connecting longitudinal cross sections of an oval shape to each other.

In the array of the plurality of convex portions 60 and the plurality of non-convex portions STc, the shape of each of the convex portion 60 and the non-convex portion STc may not be uniform, for example, the array may be a mixture of the top view array illustrated in FIG. 3A and the array in which the cross sections of an oval shape are continuous with each other.

The silicon column 61 may have various shapes other than the shape in the example illustrated in FIG. 3A.

For example, the silicon column 61 may have a shape elongated (for example, longitudinal cross-sectional shape of an oval shape) toward the non-convex portions STc on the opposite sides of the convex portion 60. As such, the silicon columns 51 and 61 may not have the same cross-sectional shape, and the same cross-sectional area.

The silicon column 61 may not extend over the entire distance from an upper surface of the stopper layer STP to the selection gate SG. In this case, different from the example illustrated in FIG. 3A, the silicon column 61 may not be seen in a top view.

The entire convex portion 60 may not include the silicon column 61.

In the formation of the plurality of convex portions 60, the convex portions 60 having the silicon columns 61 in the above-mentioned states may be mixed.

Different from the example illustrated in FIG. 3A, the convex portion 60 and the non-convex portion STc may be integrally made.

For example, the term "being integrally made" refers to a state in which there is no boundary or interface between the convex portion 60 and the non-convex portion STc, and the convex portion 60 and the non-convex portion STc are not recognized as individual configurations.

The plurality of convex portions and non-convex portions may be made by mixing the convex portions 60 and the non-convex portions STc which are individually made, and the convex portions 60 and the non-convex portions STc which are integrally made.

The non-convex portions STc may be disposed at positions other than those in the example illustrated in FIG. 3A.

For example, the non-convex portions STc may not pass through a center point of each of the convex portions 60. The non-convex portion STc may be disposed to not be aligned with the center point of the convex portion 60 and being offset toward the silicon column 51. As a result, the convex portion 60 may protrude only on one side of the plate ST in the lateral direction.

The array of the non-convex portions STc which extend in the row direction may not be perfectly parallel with the array of the convex portions 60. As a result, the disposition of the non-convex portion STc with respect to the convex portion 60 may change, for example, the non-convex portion STc may pass through the center point of the convex portion 60 at a certain position, and may be disposed to not be aligned with the center point of the convex portion 60 at a certain position.

The disposition of the non-convex portion STc with respect to the convex portion 60 may not be uniform, for example, when the array pattern of the silicon column 51 and the plate ST is repeated multiple times in the column direction, some of the non-convex portions STc may pass through the center points of the convex portions 60, respectively, and some of the non-convex portions STc may be respectively disposed to not be aligned with the center points of the convex portions 60.

Wiring

As illustrated in FIGS. 1 to 3A, an insulating layer 34 is provided on the selection gate SG. The silicon column 51 is connected to a source line SL or a bit line BL via a contact CT. The contact CT contains a conducting material such as metal, polysilicon, or silicide.

The source line SL extends in the row direction R while connecting first ends of the U-shaped memory strings MS which are adjacent to each other in the column direction C. The bit line BL extends in the column direction C while connecting the memory strings MS which are aligned in the column direction C.

Contacts are respectively connected to an end portion of the source line SL, the back gate BG, the selection gate source SGS, and the selection gate drain SGD in the row direction R. Contacts are respectively connected to each stage of the plurality of word lines WL. These connectors are respectively connected to wirings (not illustrated).

(2) Disposition of First Pillar and Second Pillar on Semiconductor Substrate

An example of the disposition of the pillars according to the embodiment will be described with reference to FIG. 3A.

The silicon column 51, the silicon column 61, and another silicon column 61 as a third pillar are disposed as follows.

The silicon column 61 is disposed to not be aligned with the silicon column 51 in a first direction that is along the upper surface of the semiconductor substrate 10. The direction along the upper surface of the semiconductor substrate 10 is a direction horizontal or substantially horizontal with respect to the upper surface of the semiconductor substrate 10, for example, the direction may include the row direction R, the column direction C, and a plurality of directions other than the row direction R and the column direction C. The first direction is an arbitrary direction among the plurality of horizontal directions.

The third pillar is another silicon column 61 among the plurality of silicon columns 61, which is different from the silicon column 61 that is present in the first direction. The third pillar is disposed to not be aligned with the silicon column 51 in a second direction that is along the upper surface of the semiconductor substrate 10. The second direction is a horizontal direction that is different from the first direction.

The memory film 52 which surrounds the silicon column 51 is separated from the second insulating film (the insulating film 62 and the insulating member of the non-convex portion STc) that surrounds the silicon column 61 and the third pillar.

As illustrated in FIG. 3A, in the BiCS memory 1, the silicon columns 51 and the silicon columns 61 are disposed in a regular array along the upper surface of the semiconductor substrate 10. The term "regular array" refers to a state in which at least one of a gap between the silicon column 51 and the silicon column 61, the disposition and the array pitch of the silicon columns 51 and the silicon columns 61, and the like is set according to a given rule. As will be described later, the "regular array" may include variations due to manufacturing tolerances of the memory string MS and the like.

Specifically, for example, the silicon columns 51 and the silicon columns 61 are arrayed along the row direction R with an arbitrary gap maintained therebetween, respectively. A row of the silicon columns 51 and a row of the silicon columns 61 are alternately disposed in the column direction C. That is, the silicon column 61 is arrayed between rows of the silicon columns 51 which are arrayed in the row direction R.

Due to this array, the silicon columns 51 and the silicon columns 61 are respectively disposed at the intersections of a matrix shape along the upper surface of the semiconductor substrate 10. That is, the silicon columns 51 and the silicon columns 61 are disposed in a matrix array which has a planar area above the semiconductor substrate 10, and takes the upper surface of the semiconductor substrate 10 as its reference. Alternatively, an array of the silicon columns 51 and the silicon columns 61 may form a matrix which line up in the row direction R and the column direction C.

In the BiCS memory 1, a pitch P between the silicon column 61 and the silicon column 51 adjacent thereto is equal to a pitch P between the adjacent silicon columns 51. In addition, a pitch P between the adjacent silicon columns 61 may be equal to the pitch P between the adjacent silicon columns 51.

The pitch P between the silicon column 51 and the silicon column 61 is the distance between the center point of a circular upper surface of the silicon column 51 and the center point of a circular upper surface of the silicon column 61. The pitch P between the silicon columns 51 is the distance between the respective center points of the silicon columns 51. The pitch P between the silicon columns 61 is the distance between the respective center points of the silicon columns 61. For example, the center point of the silicon column 61 coincides with the center point of the convex portion 60 of the plate ST.

As such, the silicon columns 51 and the silicon columns 61 are disposed along the upper surface of the semiconductor substrate 10 with an equal gap held therebetween.

Here, it should be understood that "equal pitch P" or "equal gap" includes tolerances resulting from a process of manufacturing the BiCS memory 1 which will be described later.

In the BiCS memory 1, a gap S1 is less than a gap S2.

The gap S1 is the distance between the memory film 52 and the convex portion 60 adjacent thereto. In other words, for example, the gap S1 is the distance between an edge of the memory film 52, which faces the convex portion 60, and an edge of the convex portion 60, which faces the memory film 52. In other words, for example, the gap S1 is the minimum dimension between the edge of the memory film 52 and the edge of the convex portion 60. A gap S2 is a gap between the non-convex portion STc and the memory film 52 adjacent thereto. In other words, for example, the gap S2 is the distance between the edge of the memory film 52, which faces the non-convex portion STc, and an edge of the non-convex portion STc, which faces the memory film 52. In other words, for example, the gap S2 is the minimum dimension between the edge of the memory film 52 and the edge of the non-convex portion STc.

In the BiCS memory 1, in case that the silicon columns are elongated in the column direction, a gap S3 may be less than the gap S2. A gap S4 may be less than the gap S2.

The gap S3 is a gap between the adjacent memory films 52. In other words, for example, the gap S3 is the distance between the respective edges of the adjacent memory films 52, which face each other. In other words, the gap S3 is the minimum dimension between the respective edges of the memory films 52. The gap S4 is a gap between the adjacent convex portions 60. In other words, for example, the gap S3 is the distance between the respective edges of the adjacent convex portions 60, which face each other. In other words, for example, the gap S4 is the minimum dimension between the respective edges of the convex portions 60.

(3) Method of Manufacturing BiCS Memory

A method of manufacturing the semiconductor memory device according to the embodiment will be described with reference to FIGS. 3A to 3C. According to the embodiment, the convex portions 60 are formed in a process of forming the silicon columns 51 and the memory films 52.

In the method of manufacturing the BiCS memory 1, first, the semiconductor substrate 10 having the plurality of conducting layers 22 and the plurality of insulating layers 32 is prepared.

Specifically, the conducting layer 21 (back gate BG) and the insulating layer 31 are formed above the prepared semiconductor substrate 10. The conducting layer 21 is provided with the portion that connects the silicon columns 51. The stopper layer STP is formed in the insulating layer 31. The plurality of conducting layers 22 and the plurality of insulating layers 32 are formed above the conducting layer 21 and the insulating layer 31. The insulating layer 33 and the conducting layer 23 (selection gate SG) are formed above the plurality of conducting layers 22 and the plurality of insulating layers 32.

Subsequently, memory hole patterns MHp and dummy hole patterns DHp are transferred to an uppermost surface of the semiconductor substrate 10, that is, the conducting layer 23, using a mask M1 as a transfer film illustrated in FIG. 3B.

Specifically, the conducting layer 23 is coated with a photoresist film or the like, and the photoresist film is developed via light exposure using the mask M1. The mask M1 is a mask for transferring the memory hole patterns MHp. The mask M1 has the dummy hole patterns DHp in addition to the memory hole patterns MHp.

The memory hole patterns MHp are formed of a plurality of circular openings, respectively. In a top view, the plurality of openings are disposed so as to overlap the silicon columns 51 and the memory films 52, respectively. The photoresist film is exposed to light and is developed using the memory hole patterns MHp, and thereby the openings of the photoresist film are made at predetermined formation positions of the silicon columns 51 and the memory films 52.

The curvature of the circle of the memory hole pattern MHp may be adjusted so as to obtain a transfer pattern having a true circular shape or a shape close to a true circle. By virtue of this adjustment, the cross section of each of the silicon column 51 and the memory film 52 which will be formed in a later process is a true circular shape or a shape close to a true circle. As a result, in the memory cell transistor MTr, an electric field of the word line WL is likely to uniformly affect the silicon column 51 and the memory film 52, and the controllability of the memory cell transistor MTr improves. The memory hole pattern MHp may have another shape than a circular shape or a shape close to a true circle.

The dummy hole patterns DHp are formed of a plurality of circular openings, respectively. The plurality of openings are respectively disposed at positions in which the convex portions 60 are disposed. The photoresist film is exposed to light and is developed using the dummy hole patterns DHp, and thereby the openings of the photoresist film are made at predetermined formation positions of the convex portions 60.

The curvature of the circle of the dummy hole pattern DHp may be adjusted so as to be the same curvature of the circle of the memory hole pattern MHp. The dummy hole pattern DHp may have another shape than the above-mentioned shape; however, when the dummy hole pattern DHp is made to have the same size and shape as the memory hole pattern MHp, the mask M1 is easily manufactured.

As described above, in the mask M1, a plurality of circular patterns including the memory hole pattern MHp and the dummy hole pattern DHp are disposed in a regular array. Here, the "regular array" includes process variations originating from a process of manufacturing the mask M1.

Subsequently, each layer above the semiconductor substrate 10 is etched using the photoresist film with the transferred patterns MHp and DHp as a mask, and memory holes and dummy holes are formed above the semiconductor substrate 10.

The memory hole passes through the conducting layer 23, the insulating layer 33, the plurality of conducting layers 22 and the plurality of insulating layers 32 in the stacking direction V, and extends into the conducting layer 21. For example, the shape of the memory hole is a circular cylinder. A bottom portion of the memory hole reaches the top of the connection portion between the silicon columns 51 which is formed in the conducting layer 21.

The dummy hole extends in the stacking direction V while passing through the conducting layer 23, the insulating layer 33, the plurality of conducting layers 22 and the plurality of insulating layers 32. For example, the shape of the dummy hole is a circular cylinder. A bottom portion of the dummy hole reaches the top of the stopper layer STP that is formed in the insulating layer 31.

Subsequently, the silicon column 51 and the memory film 52 are formed in the memory hole, and the convex portion 60 is formed in the dummy hole.

Specifically, the above-mentioned arbitrary materials are sequentially stacked in the memory hole and the dummy hole. Accordingly, the memory film 52 is formed in the memory hole. At this time, the insulating film 62 made of the same material as the memory film 52 may be formed in the dummy hole. In addition, the silicon column 51 is formed in the memory hole. At this time, the silicon column 61 made of the same material as the silicon column 51 may be formed in the dummy hole.

Subsequently, groove patterns STp are transferred to the conducting layer 23 using a mask M2 illustrated in FIG. 3C.

Specifically, the conducting layer 23 is coated with a photoresist film or the like, and the photoresist film is developed via light exposure using the mask M2. The mask M2 has the groove patterns STp. The groove pattern STp is formed of a straight opening which extends in the row direction R. The openings are respectively disposed at positions in which the non-convex portions STc are disposed, and are non-intermittently disposed. The photoresist film is exposed to the light and is developed using the groove patterns STp, and thereby the non-intermittent slit-shaped openings of the photoresist film are made at predetermined formation positions of the non-convex portions STc, and at positions which overlap the positions of the convex portions 60.

Subsequently, each layer above the semiconductor substrate 10 is etched by using the photoresist film with the transferred groove patterns STp as a mask, and grooves are formed above the semiconductor substrate 10.

The groove passes through the conducting layers 22 and 23, and the insulating layer 31 and 32 in the stacking direction V, and extends intermittently in the row direction R. That is, primarily, the slit-shaped grooves are intermittently formed at the predetermined formation positions of the non-convex portions STc except for the formation positions of the convex portions 60. A part or the entirety of the convex portion 60 may be etched. A bottom portion of the groove reaches the top of the stopper layer STP which is formed in the insulating layer 31.

Subsequently, the non-convex portion STc is formed in the groove.

Specifically, for example, an insulating material is embedded in the groove. When a part or the entirety of the convex portion 60 is etched, an insulating material may be embedded in the etched portion.

As such, the plate ST including the convex portions 60 and the non-convex portions STc is formed. Even though the position of the convex portion 60 is not slightly aligned with the position of the non-convex portion STc due to positional alignment accuracy when the patterns are exposed to light and are developed, process variations, or the like, the non-alignment of the positions is allowed insofar as element separation is achieved. When the silicon column 51 is disposed near one lateral side of the plate ST due to this non-alignment, the convex portion 60 may protrude toward one lateral side of the plate ST.

As such, the memory string MS of the BiCS memory 1 is manufactured. Here, the method of manufacturing the memory string MS, the sequence of processes, and the like are not limited to those in the embodiment. For example, the sequence of exposing the memory hole pattern MHp and the dummy hole pattern DHp, and the groove pattern STp to light, the sequence of forming the silicon column 51 and the memory film 52, the convex portion 60, and the plate ST, and the like may be appropriately changed.

(4) Effects of Embodiment

According to the embodiment, one or a plurality of the following effects may be obtained.

(A) According to the embodiment, the surface of the plate ST, which faces the silicon column 51, has convex portions and non-convex portions.

(B) According to the embodiment, the center points of the convex portions 60 of the plate ST and the center points of the silicon columns 51 adjacent thereto are disposed in a regular array along the upper surface of the semiconductor substrate 10. That is, the silicon columns 51 and the silicon columns 61 are disposed in a regular array along the upper surface of the semiconductor substrate 10.

These configurations (A) and (B) may improve process accuracy for the memory hole in the process of manufacturing the BiCS memory 1, and the reasons for this are described below.

As illustrated in FIG. 4A, in a BiCS memory of a comparative example, the respective end portions of U-shaped memory strings MSr are arrayed along the row direction R. A non-intermittent straight plate STr extends in the row direction R while passing between rows of memory strings MSr. For example, such a BiCS memory is manufactured using masks M1r and M2r illustrated in FIGS. 4B and 4C. The mask M1r has memory hole patterns MHpr. The mask M2r has non-intermittent slit-shaped groove patterns STpr.

As illustrated in FIG. 4B, the memory hole patterns MHPr are not disposed at positions in which the plates STr are formed. For this reason, in the mask M1r, a pattern interval in the column direction C is greater than a pattern interval in the row direction R. According to FIG. 4A that illustrates the BiCS memory after the memory strings MSr are formed, a pitch P1 between the memory strings MSr, which face each other in the column direction C with the plate STr interposed between the memory strings MSr, is greater than a pitch P2 between the memory strings MSr adjacent to each other in the row direction R.

When the BiCS memory is manufactured, positional variations may occur in the process of forming the memory string MSr, and in the process of forming the plate STr. For example, the positional variations are taken into consideration the disposition of the memory string MSr and the plate STr, and the memory string MSr and the plate STr are disposed with a gap maintained therebetween in such a manner that a short circuit, an open circuit, or the like is not caused by interference therebetween. Accordingly, the difference between the pitch P1 and the pitch P2 increases further.

When the memory hole patterns MHp are disposed without a regular gap maintained therebetween, the accuracy of light exposure and development may decrease. That is, optical proximity effects increase interference in portions in which there is no regularity in the disposition of the memory hole patterns MHpr, and thereby, for example, the transfer patterns may not be formed into a true circular shape but an elliptical shape. At this time, in the memory cell transistor which will be formed in a later process, the influence of an electric field of the word line WL varies depending on a circumferential position. As illustrated by the dotted line in FIG. 4B, even though the curvature of the memory hole pattern MHpr is adjusted in advance, there is limitation in correcting to the extent that the transfer pattern having a true circular shape is obtained.

According to the embodiment, the dummy hole patterns DHp are disposed at the formation positions of the plates ST. The silicon columns 61 and the silicon columns 51 formed in this manner are disposed along the upper surface of the semiconductor substrate 10 in such a manner that the silicon columns 61 and the silicon columns 51 are positioned at the intersections of a matrix shape. At this time, for example, a pitch P between the silicon column 61 and the silicon column 51 adjacent thereto is equal to a pitch P between the adjacent silicon columns 51.

Accordingly, the memory hole patterns MHp may be transferred using the mask M1 having regular circular patterns. As a result, the occurrence of transfer defects associated with light exposure or development may be prevented, for example, the formation of the transfer pattern having an elliptical shape may be prevented. Accordingly, in the silicon column 51 and the memory film 52, the memory string MS having a desired cross-sectional shape is easily obtained, and for example, variations of an electric field of the word line WL are prevented.

(B) According to the embodiment, the gap S1 between the convex portion 60 of the plate ST and the memory film 52 of the silicon column 51 adjacent thereto is less than the gap S2 between the non-convex portion STc of the plate ST and the memory film 52 of the silicon column 51 adjacent thereto. The patterns are disposed in this manner, whereby the memory strings MS may be disposed at high density.

As described in the comparative example, when the memory strings MSr are formed using the mask M1r illustrated in FIGS. 4B and 4C, there is limitation in reducing a pattern interval of the mask M1r due to optical proximity effects associated with the irregular patterns.

According to the embodiment, the memory hole patterns MHp are transferred using the mask M1 with the regular patterns. Accordingly, the memory hole patterns MHp and the memory strings MS may be disposed at high density while the occurrence of transfer defects associated with light exposure or development is prevented. That is, for example, the memory strings MS and the plates ST may be disposed in such a manner that the gap S1 is less than the gap S2.

(C) According to the embodiment, the convex portions 60 are formed in the process of forming the silicon columns 51 and the memory films 52. Accordingly, the process of forming the convex portions 60 which are dummy may be easily incorporated into the process of forming the memory strings MS. Since the silicon columns 51 and the memory films 52, and the convex portions 60 are collectively formed, an increase in the number of processes is not required. Accordingly, the complexity of the manufacturing processes and an increase in manufacturing costs may be prevented.

(D) According to the embodiment, the dummy hole patterns DHp are transferred to the conducting layer 22 and the insulating layer 32 according to the patterns of the mask M1 for transferring the memory hole patterns MHp. Accordingly, the memory hole patterns MHp and the dummy hole patterns DHp may be collectively formed. The preparation of the mask M1 of one type is enough to transfer these patterns, and errors associated with process conversion are easily managed.

With the configuration described in (D), the mask M1 for transferring the memory hole patterns MHp has the regular disposition of the patterns, and the process accuracy of the memory holes improves.

Second Embodiment

Figure 5A:
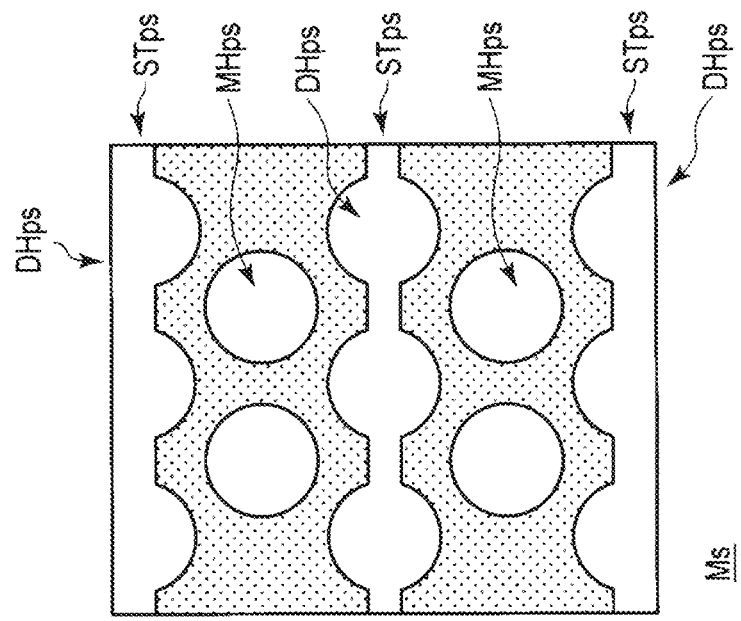
FIGS. 5A to 5B are views illustrating a semiconductor memory device according to a second embodiment and a method of manufacturing the same, where

Hereinafter, a semiconductor memory device according to an embodiment will be described with reference to FIGS. 5A and 5B.

(1) Example of Configuration of BiCS Memory and Method of Manufacturing BiCS Memory A BiCS memory 2 as the semiconductor memory device according to the embodiment is different from the above-mentioned embodiment in that silicon columns 51s and memory films 52s, and plates STs are collectively formed in the same process.

That is, according to the embodiment, convex portions 60s are formed in the process of forming the silicon columns 51s and the memory films 52s. Non-convex portions STcs are formed in the process of forming the silicon columns 51s and the memory films 52s.

Figure 5B:
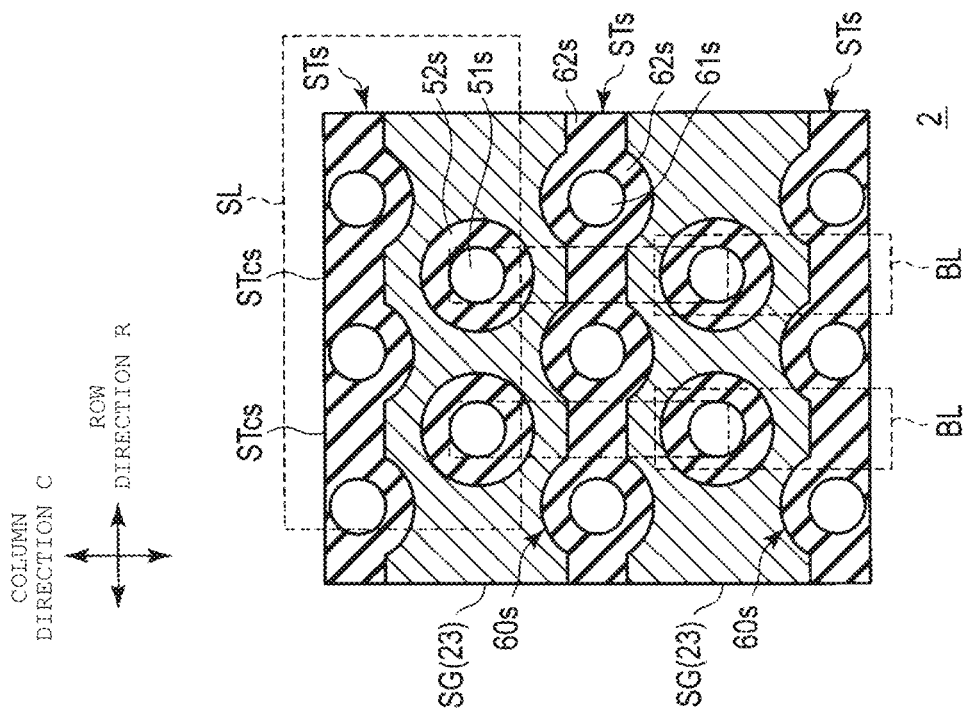

A mask Ms illustrated in FIG. 5B is a transfer film for transferring memory hole patterns MHps. The mask Ms has dummy hole patterns DHps and groove patterns STps in addition to the memory hole patterns MHps.

The memory hole patterns MHps and the dummy hole patterns DHps are respectively disposed at the intersections of a matrix shape. The groove patterns STps are disposed so as to overlap the dummy hole patterns DHps which are arrayed in the row direction R. More specifically, the memory hole patterns MHps are respectively formed of a plurality of circular openings, and the dummy hole patterns DHps are respectively formed of a plurality of circular openings. The groove patterns STps are respectively formed of straight openings which extend in the row direction R. In a top view, the opening of the memory hole pattern MHps is disposed so as to overlap the silicon column 51s and the memory film 52s. The opening of the dummy hole pattern DHps is disposed at a position in which the convex portion 60 is disposed. The opening of the groove pattern STps is disposed at a position in which the non-convex portion STcs is disposed.

The patterns of the mask Ms are transferred to the conducting layer 23 using the mask Ms, and the layers above the semiconductor substrate 10 are etched, whereby dummy holes respectively connected to memory holes via grooves are formed. As illustrated in FIG. 5A, the silicon columns 51s, the memory films 52s, the convex portions 60s, and the non-convex portions STcs are formed by filling these holes with the above-mentioned arbitrary materials.

In a process of filling (stacking) the memory hole with the material of the memory film 52s, at least a part of the dummy hole and almost entire region of the groove connecting the dummy holes are also filled with the same material, and thus an insulating film 62s is formed. The entirety of the dummy hole may be filled with the insulating film 62s. In a process of filling (stacking) the memory hole with the material of the silicon column 51s, at least a part of the dummy hole is filled with the same material, and thus a silicon column 61s may be formed.

Accordingly, the non-convex portion STcs is filled with an insulating member made of the same material as the memory film 52s and the insulating film 62s. Accordingly, the plate STs has the function of element separation.

As described above, a memory string MSs according to the embodiment is manufactured.

(2) Effects of Embodiment

According to the embodiment, in addition to the effects of the above-mentioned embodiment, one or a plurality of the following effects may be obtained.

(A) According to the embodiment, the convex portions 60s and the non-convex portions STcs are formed in the process of forming the silicon columns 51s and the memory films 52s. Accordingly, the memory strings MSs and the plates STs may be collectively formed, and the number of manufacturing processes and manufacturing costs may be reduced.

(B) According to the embodiment, the dummy hole patterns DHps and the groove patterns STps are transferred to the plurality of conducting layers 22 and the plurality of insulating layers 32 according to the patterns of the mask Ms. Accordingly, the number of masks used in the manufacturing processes may be reduced, and errors associated with process conversion are easily managed. Since it is not necessary to separately transfer the groove patterns STps, labor and time required for position alignment may be reduced, and defects such as the non-alignment of positions may be prevented. Accordingly, manufacturing costs may be reduced. It is not necessary to provide a margin of position alignment for the light exposure and development of the memory hole pattern MHps and the groove pattern STps, and the memory strings MSs may be disposed at high density.

(C) According to the embodiment, the diameter of the memory hole pattern MHps is set to be a dimension close to a light exposure limit, and the width of the groove pattern STps is set to be a dimension less than the light exposure limit, and thereby the memory strings MSs may be disposed at much higher density. If interference between the groove pattern STps and the dummy hole pattern DHps is intentionally generated by using optical proximity effects, the groove pattern STps not intended for light exposure is subjected to light exposure. As such, the entire configuration of a region of a dimension less than the light exposure limit may be fine-fabricated. Accordingly, the memory hole patterns MHps may be disposed at high density, and the memory strings MSs are disposed at high density.

(D) According to the embodiment, the memory hole and the groove may be filled with an insulating member made of the same material. Accordingly, the number of types of a material is reduced, whereby costs may be reduced.

Other Embodiment

The above-mentioned embodiments are given as examples, and the material, shape, structure, disposition, and the like of each configuration component are not limited. New embodiments may be implemented in other various forms, and in an implementation stage, various omissions, replacements, and changes may be made insofar as the omissions, the replacements, and the changes do not depart from the scheme of the embodiments. In addition, each of the embodiments include various stages, and various embodiments may be extracted by appropriately combining a plurality of the disclosed configuration requirements.

In the examples of the embodiments, the silicon columns 51 and the memory films 52, and the convex portions 60 are disposed as illustrated in FIG. 3A; however, the disposition is not limited thereto in the embodiments. If a transfer film having the regular disposition of patterns may be used, the first pillar and the second pillar may be disposed in any manner. For example, the plates and the convex portions accompanying thereto may be provided in not every a row of the first pillar, but every a plurality of rows.

In the examples of the embodiments, as illustrated in FIG. 3A, the gap S1 is less than the gap S2; but the relationship between the sizes of the gaps is not limited thereto in the embodiments. For example, the plate may be configured to have a width greater than or equal to the diameter of the second pillar and the insulation film at the surroundings thereof, and the gap S1 may be set not to be less than the gap S2.

In the examples of the embodiments, the memory string MS has a U shape and has the portion that connects the silicon column 51 and the memory film 52, and the silicon column 51; however, the configuration is not limited thereto in the embodiment. For example, the memory string having an I shape may be made, which does not have the connection portion.

For example, the configuration of the memory cell array may be as disclosed in U.S. Patent Application Publication No. 2009/0267128 (U.S. patent application Ser. No. 12/407,403) entitled "Three dimensional stacked nonvolatile semiconductor memory". In addition, the configuration of the memory cell array may be as disclosed in the following publications: U.S. Patent Application Publication No. 2009/0268522 (U.S. patent application Ser. No. 12/406,524) entitled "Three dimensional stacked nonvolatile semiconductor memory"; U.S. Patent Application Publication No. 2010/0207195 (U.S. patent application Ser. No. 12/679,991) entitled "Non-volatile semiconductor storage device and method of manufacturing the same"; and U.S. Patent Application Publication No. 2011/0284946 (U.S. patent application Ser. No. 12/532,030) entitled "Semiconductor memory and method for manufacturing same". The entirety of content of the patent applications is incorporated herein by reference.

In the embodiments, the memory cell may adopt a binary memory method, or a multiple-value memory method. Hereinafter, the read operation, write operation, and erase operation of the memory cell which adopts a multiple-value memory method will be described in detail.

For example, multiple levels of read operations are formed of an A-level read operation, a B-level read operation, a C-level read operation, and the like, the threshold voltage of each of which increases from the A-level to the C-level. For example, a voltage applied to word lines selected in the A-level read operation of the read operations is between 0 V and 0.55 V. The voltage is not limited to between 0 V and 0.55 V, and may be any one of between 0.1 V and 0.24 V, between 0.21 V and 0.31 V, between 0.31 V and 0.4 V, between 0.4 V and 0.5 V, between 0.5 V and 0.55 V, and the like. For example, a voltage applied to word lines selected in the B-level read operation is between 1.5 V and 2.3 V. The voltage is not limited to between 1.5 V and 2.3 V, and may be any one of between 1.65 V and 1.8 V, between 1.8 V and 1.95 V, between 1.95 V and 2.1 V, between 2.1 V and 2.3 V, and the like. For example, a voltage applied to word lines selected in the C-level read operation is between 3.0 V and 4.0 V. The voltage is not limited to between 3.0 and 4.0, and may be any one of between 3.0 V and 3.2, between 3.2 V and 3.4 V, between 3.4 V and 3.5 V, between 3.5 V and 3.6 V, between 3.6 V and 4.0 V, and the like. For example, a time (tR) for the read operation preferably is any one of between 25 μs and 38 μs, between 38 μs and 70 μs, between 70 μs and 80 μs, and the like.

The write operation includes a program operation and a verify operation. For example, an initial voltage applied to word lines selected in the program operation of the write operation is between 13.7 V and 14.3 V. The initial voltage is not limited to between 13.7 V and 14.3 V, and may be any one of between 13.7 V and 14.0 V, between 14.0 V and 14.6 V, and the like. An initial voltage applied to word lines which are selected when odd-numbered word lines are written may be different from an initial voltage applied to word lines which are selected when even-numbered word lines are written. For example, when the program operation is executed using an incremental step pulse program (ISPP) method, a step-up voltage of approximately 0.5 V is used. For example, a voltage applied to non-selected word lines may be between 6.0 V and 7.3 V. The voltage applied to the non-selected word lines is not limited to between 6.0 V and 7.3 V, and for example, may be between 7.3 V and 8.4 V, or may be 6.0 V and less. A pass voltage applied to word lines may change depending on whether the non-selected word lines are the odd-numbered word lines or the even-numbered word lines. For example, a time (tProg) for the write operation preferably is between 1,700 µs and 1,800 µs, between 1,800 µs and 1,900 µs, or between 1,900 µs and 2,000 µs.

For example, in the erase operation, an initial voltage of between 12 V and 13.6 V is applied to wells which are formed on the semiconductor substrate and above which the memory cells are disposed. The initial voltage is not limited to between 12 V and 13.6 V, and may be any one of between 13.6 V and 14.8 V, between 14.8 V and 19.0 V, 19.0 V and 19.8 V, between 19.8 V and 21 V, and the like. For example, a time (tErase) for the erase operation preferably is between 3,000 µs and 4,000 µs, between 4,000 µs and 5,000 s, or between 4,000 µs and 9,000 µs.

The embodiments may be also applied to a planar NAND-type flash memory. The planar NAND-type flash memory is a NAND-type flash memory in which memory cells are arrayed in a plane. At this time, for example, the memory cell may have the following structure.

The memory cell has charge accumulating films that are disposed on a semiconductor substrate, for example, a silicon substrate with a tunnel insulating film having a film thickness of 4 nm to 10 nm interposed between the charge accumulating films. The charge accumulating film may have a stacking structure in which the following films are stacked on each other: an insulating film having a film thickness of 2 nm to 3 nm, for example, an silicon nitride (SiN) films or a silicon oxynitride (SiON) film; and a polysilicon (Poly-Si) film having a film thickness of 3 nm to 8 nm. Metal such as ruthenium (Ru) may be added to the polysilicon film. The memory cell has an insulating film on the charge accumulating film. For example, the insulating film has a silicon oxynitride (SiO) film having a film thickness of 4 nm to 10 nm which is interposed between a lower-layer High-k film having a film thickness of 3 nm to 10 nm and an upper-layer High-k film having a film thickness of 3 nm to 10 nm. Hafnium oxide (HfO) or the like is used as the material of the High-k film. The thickness of the silicon oxide film may be made thicker than the thickness of the High-k film. A control electrode having a film thickness of 30 nm to 70 nm is formed on the insulating film, with a film having a film thickness of 3 nm to 10 nm interposed between the control electrode and the insulating film. Here, the examples of the work function adjustment film include a metal oxide film such as a tantalum oxide (TaO) film, a metal nitride film such as a tantalum nitride (TaN) film, and the like. Tungsten (W) or the like may be used as the material of the control electrode. An air gap may be formed between the memory cells.

Supplementary Note

The supplementary notes of preferred aspects of embodiments are as follows.

Supplementary Note 1

According to one aspect of an embodiment, there is provided a semiconductor memory device including: a pair of a conducting layer and an insulating layer that are disposed above a semiconductor substrate; a plurality of pillars that extend in the pair of the conducting layer and the insulating layer in a direction which intersects a first surface of the semiconductor substrate; and a plate that is disposed between the plurality of pillars, and is provided in the pair of the conducting layer and the insulating layer so as to face the plurality of pillars. A surface of the plate, which faces the pillar, has convex portions and non-convex portions.

Supplementary Note 11

According the semiconductor memory device described in supplementary note 1, the plate has a plurality of convex portions that protrude toward the plurality of pillars on lateral opposite sides of the plate, and a plurality of non-convex portions, each of which is interposed between the adjacent convex portions of the plurality of convex portions.

Supplementary Note 12

According to the semiconductor memory device described in supplementary note 11, the center points of the convex portions of the plate and the center points of the pillars are respectively disposed at the intersections of a matrix shape along the first surface of the semiconductor substrate.

Supplementary Note 2

According to another aspect of an embodiment, there is provided a semiconductor memory device including: a pair of a conducting layer and an insulating layer that are disposed above a semiconductor substrate; a plurality of first pillars that extend in the pair of the conducting layer and the insulating layer in a direction which intersects a first surface of the semiconductor substrate; a plurality of second pillars that extend in the pair of the conducting layer and the insulating layer in the direction which intersects the first surface of the semiconductor substrate; and a non-convex portion that is provided in the pair of the conducting layer and the insulating layer so as to face the first pillars, and that connects the adjacent second pillars of the plurality of second pillars. The first pillars and the second pillars are disposed in a regular array along the first surface of the semiconductor substrate.

Supplementary Note 3

According to still another aspect of an embodiment, there is provided a semiconductor memory device including: a pair of a conducting layer and an insulating layer that are disposed above a semiconductor substrate; a first pillar that extends in the pair of the conducting layer and the insulating layer in a direction which intersects a first surface of the semiconductor substrate; a second pillar that is disposed while being biased from the first pillar in a first direction along the first surface of the semiconductor substrate, and extends in the pair of the conducting layer and the insulating layer in the direction which intersects the first surface of the semiconductor substrate; a third pillar that is disposed while being biased from the first pillar in a second direction along the first surface of the semiconductor substrate, and extends in the pair of the conducting layer and the insulating layer in the direction which intersects the first surface of the semiconductor substrate; a first insulating film that surrounds the first pillar; and a second insulating film that surrounds the second pillar and the third pillar. The first insulating film is separated from the second insulating film.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first stack of layers including a plurality of first conductive layers and a plurality of first insulating layers alternately disposed in a first direction, the first stack extending in a second direction crossing the first direction;
an interlayer plate extending in the first direction and the second direction, the interlayer plate being provided adjacent to the first stacked layer in a third direction crossing the first direction and the second direction;
second stack of layers including a plurality of second conductive layers and a plurality of second insulating layers alternately disposed in the first direction, the second stack being provided adjacent to the interlayer plate in the third direction;
a first columnar member extending through the first stack in the first direction and including a first semiconductor member and a first film formed around the first semiconductor member;
a second columnar member extending through the second stack in the first direction and including a second semiconductor member and a second film formed around the second semiconductor member; and
a third columnar member extending through the interlayer plate in the first direction and including a third semiconductor member,
wherein the first semiconductor member and the second semiconductor member are electrically connected to a first bit line and the third semiconductor member is not electrically connected to a conductor.

2. The semiconductor memory device according to claim 1, wherein the third columnar member includes a third film formed adjacent to the third semiconductor member.

3. The semiconductor memory device according to claim 1, further comprising:
a first memory portion provided between the first semiconductor member and one of the plurality of first conductive layers; and
a second memory portion provided between the second semiconductor member and one of the plurality of second conductive layers.

4. The semiconductor memory device according to claim 1, wherein the first film, the second film, and the third film contain a same material.

5. The semiconductor memory device according to claim 1, wherein the intermediate plate includes a plurality of protrusions arranged in the second direction.

6. The semiconductor memory device according to claim 1, wherein the intermediate plate includes an insulating material.

7. The semiconductor memory device according to claim 1, wherein the first columnar member penetrates the first stacked layer.

8. The semiconductor memory device according to claim 1, wherein a length of the first columnar member in the first direction is longer than a length of the third columnar member in the first direction.

9. The semiconductor memory device according to claim 1, wherein the first bit line extends in the third direction.

10. The semiconductor memory device according to claim 1, wherein an upper end of the third columnar member is completely covered with an insulating material.

11. The semiconductor memory device according to claim 1, wherein a lower end of the third columnar member is above a lower end of the first columnar member.

12. A semiconductor memory device comprising:
a first stack of layers including a plurality of first conductive layers and a plurality of first insulating layers alternately disposed in a first direction, the first stack extending in a second direction crossing the first direction;
an interlayer plate extending in the first direction and the second direction, the interlayer plate being provided adjacent to the first stacked layer in a third direction crossing the first direction and the second direction;
a second stack of layers including a plurality of second conductive layers and a plurality of second insulating layers alternately disposed in the first direction, the second stack being provided adjacent to the interlayer plate in the third direction;
a first columnar member extending through the first stack in the first direction and including a first semiconductor member and a first film formed around the first semiconductor member;
a second columnar member extending through the second stacked layer in the first direction and including a second semiconductor member and a second film formed around the second semiconductor member; and
a third columnar member extending through the interlayer plate in the first direction and including a third semiconductor member, wherein
the first semiconductor member and the second semiconductor member are electrically connected to a first bit line, and
an upper end of the third columnar member is completely covered with an insulating material.

13. The semiconductor memory device according to claim 12, wherein the intermediate plate includes a plurality of protrusions arranged in the second direction.

14. The semiconductor memory device according to claim 12, wherein a lower end of the third columnar member is above a lower end of the first columnar member.

15. The semiconductor memory device according to claim 12, wherein the third columnar member includes a third film formed adjacent to the third semiconductor member.

16. The semiconductor memory device according to claim 15, wherein the first film, the second film, and the third film contain a same material.

17. A semiconductor memory device comprising:
a first stack of layers including a plurality of first conductive layers and a plurality of first insulating layers alternately disposed in a first direction, the first stack extending in a second direction crossing the first direction;
an interlayer plate extending in the first direction and the second direction, the interlayer plate being provided adjacent to the first stack in a third direction crossing the first direction and the second direction;
a second stack of layers including a plurality of second conductive layers and a plurality of second insulating layers alternately disposed in the first direction, the second stack being provided adjacent to the interlayer plate in the third direction;

a first columnar member extending through the first stack in the first direction and including a first semiconductor member and a first film formed around the first semiconductor member;

a second columnar member extending through the second stack in the first direction and including a second semiconductor member and a second film formed around the second semiconductor member; and a third columnar member extending through the interlayer plate in the first direction and including a third semiconductor member, wherein a length of the first columnar member in the first direction is longer than a length of the third columnar member in the first direction.

18. The semiconductor memory device according to claim 17, wherein the intermediate plate includes a plurality of protrusions arranged in the second direction.

19. The semiconductor memory device according to claim 17, wherein a lower end of the third columnar member is above a lower end of the first columnar member.

20. The semiconductor memory device according to claim 17, wherein the third columnar member includes a third film formed adjacent to the third semiconductor member.

* * * * *